United States Patent [19]
Eckart et al.

[11] Patent Number: 5,443,684
[45] Date of Patent: Aug. 22, 1995

[54] METHOD FOR MEASURING THIN FILM THICKNESS

[75] Inventors: Donald W. Eckart, Wall; Luis M. Casas, Jersey City; Richard T. Lareau, Lakewood, all of N.J.

[73] Assignee: The United States of America as represented by the Secretary of the Army, Washington, D.C.

[21] Appl. No.: 204,018

[22] Filed: Feb. 28, 1994

[51] Int. Cl.$^6$ .............................................. H01L 21/00
[52] U.S. Cl. .................................................. 156/626.1
[58] Field of Search ................ 156/643, 345, 626, 627

[56] References Cited

U.S. PATENT DOCUMENTS

| | | | |
|---|---|---|---|
| 4,512,847 | 4/1985 | Brunsch et al. | 156/626 |
| 4,652,333 | 3/1987 | Carney | 156/626 |
| 5,236,864 | 8/1993 | Iga | 437/129 |

FOREIGN PATENT DOCUMENTS

| | | |
|---|---|---|
| 01278027 | 11/1989 | Japan . |
| 04116843 | 4/1992 | Japan . |
| 04199534 | 7/1992 | Japan . |

*Primary Examiner*—R. Bruce Breneman
*Assistant Examiner*—George Goudreau
*Attorney, Agent, or Firm*—Michael Zelenka; William H. Anderson

[57] ABSTRACT

To provide a method of measuring thin film thicknesses that is a simple, quick method for determining the thickness of layers as thin as 1-2 nm which, although destructive, consumes very little material.

3 Claims, 2 Drawing Sheets

METHOD FOR MEASURING THIN FILM THICKNESS

GOVERNMENT INTEREST

The invention described herein may be manufactured, used, sold and/or licensed by, or on behalf of, the Government of the United States of America without the payment to us of any royalties thereon.

FIELD OF THE INVENTION

The present invention relates to the precise measurement of layer thicknesses of solid state semiconductor devices, semiconductor heterostructures, or any heterostructure material system.

BACKGROUND OF THE INVENTION

Layer thickness and variation of layer thickness of III–V semiconductor thin layer structures, such as in GaAs—AlGaAs superlattices, play a vital part in determining the properties of electronic and optical devices. For example, layer thickness determines the threshold voltages in heterojunction field effect transistors and the energy levels in quantum well infrared detectors. Heretofore, layer thicknesses in superlattice structures have been measured through methods such as, secondary ion mass spectroscopy (SIMS), Auger electron spectroscopy (AES), shallow angle lapping and/or transmission electron microscopy (TEM). Unfortunately, these methods have their limitations. For example, depth resolution derived by SIMS and AES analysis is limited to a few nanometers due to ion beam mixing. Further, mechanical shallow angle lapping is time consuming process involving several polishing and cleaning steps, as well as chemical etching. Furthermore, mechanical angle lapping can resolve layers in the 8–10 nm range and only provide information about the layer thickness at the beveled edge. So far, TEM has proven the most accurate method for measuring the thickness of superlattice layers, however, preparation of TEM cross-sectional samples is very time consuming and tedious, requiring mechanical grinding, polishing, and ion milling. Further, TEM requires a substantial amount of material and it provides thickness information about only one point on the wafer. Therefore, a need exists to provide for a cost effective, simple way to determine the thicknesses of layers in heterostructures.

SUMMARY OF THE INVENTION

Accordingly, one object of the present invention is to provide a method of measuring thin film thicknesses that is a simple, quick method for determining the thickness of layers as thin as 1–2 nm which, although destructive, consumes very little material.

This and other objects of the invention are achieved by etching shallow angle crater walls which are generated by a slightly defocused ion beam, and then observing the etched structure with an optical microscope. Greater magnifications can be achieved by this method than by mechanical angle lapping because smaller angles can be generated; less material is consumed because a small crater is used instead of an entire edge; and layer thicknesses can be probed anywhere on the wafer surface simply by creating a crater at that point. This latter ability enables one to probe regions where interlayer lattice mixing has occurred such as in the vicinity of an ohmic contact.

BRIEF DESCRIPTION OF THE DRAWINGS

These and other features of the invention will become more readily apparent in light of the following Detailed Description of the Invention and the Figures wherein.

DETAILED DESCRIPTION OF THE INVENTION

The method of the present invention involves a shallow angle lapping or sputtering of a semiconductor heterostructure utilizing defocused ion beam or other particle beam to create a crater wall, chemically etching or staining the lapped area of the heterostructure to reveal the underlying layers, and viewing the lapped area to determine the thicknesses of the layers of the heterostructure. With this method, layer thickness in the 1 nm range can be resolved due to the magnification of the layer thickness caused by the shallow angle. For example, a 0.35° angle lap of the parallel to a flat surface of the heterostructure gives a magnification of 160 times, which equates to a 160 nm wide area on the beveled surface. As those skilled in the art will readily appreciate, a feature this size can be easily measured using optical microscopy.

To accomplish a preferred embodiment of the invention an ion beam or other suitable particle beam source is movably mounted adjacent a sample stage to accurately position the sample heterostructure. A rastering and/or defocusing circuit is coupled to the ion/particle beam source to accurately control the angle of the sputtered crater wall. This device could either be fashioned as a stand alone unit, if a vacuum pumping system were attached or as an additional unit to a semiconductor film growth apparatus, such as a molecular beam epitaxy or an organometallic chemical vapor deposition system.

By the present invention, in the form of an on-line examination system, heterostructures may be examined after layer growth, but before processing the wafers through to the final fabrication stage. If examined at this stage, any suspect wafers grown may be rejected thereby avoiding costly defective devices. Accordingly, a full manufacturing fabrication line would find utility in this technique.

Although the present invention, in its preferred embodiment, is described above, separate generally available equipment may be used to accomplish the objectives of the present invention. The following description is one method to accomplish the same.

Figure 1:
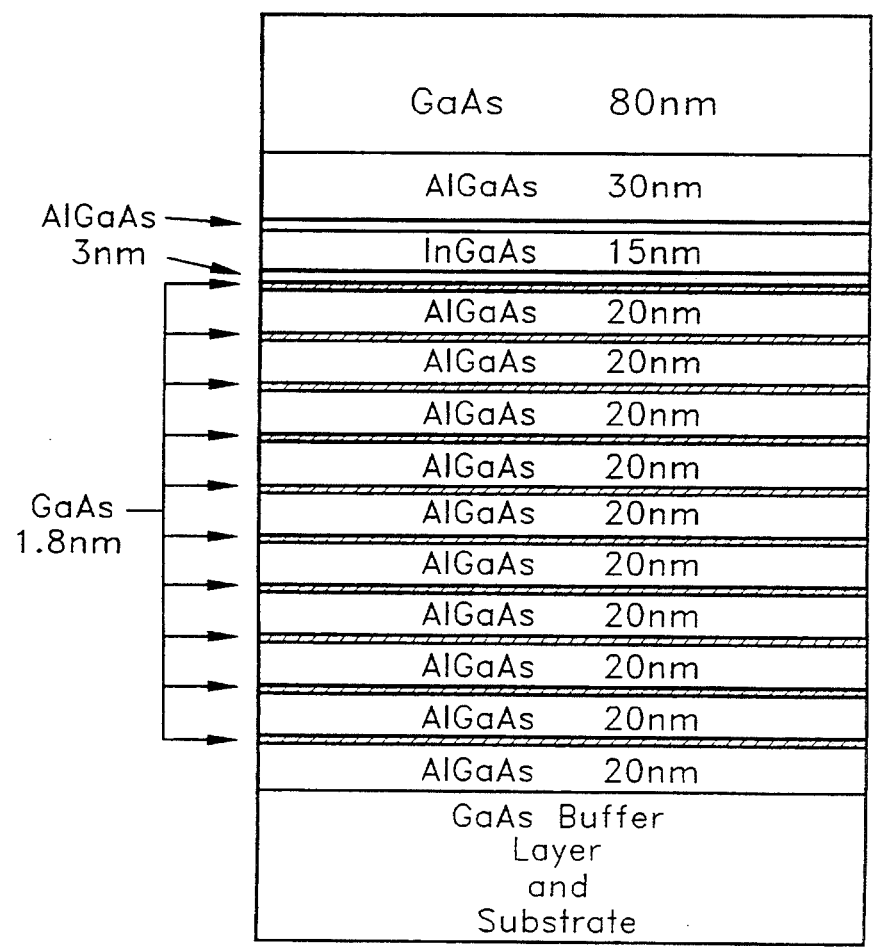
FIG. 1 is a schematic diagram of a p-HEMT structure which is also shown in FIGS. 2 and 3.

After a pseudomorphic high electron mobility transistor (p-HEMT) wafer was grown, which is nominally shown in FIG. 1, the sputter crater was created using a Perkin-Elmer PHI 660 Scanning Auger Microprobe (SAM) equipped with a duoplasmatron ion source for sputter depth profiling and a secondary electron detector for imaging. The sputtered sample was then chemically etched in order to reveal the GaAs, AlGaAs ($Al_{0.24}Ga_{0.76}As$) and InGaAs ($In_{0.16}Ga_{0.84}As$) layers. The superlattice section of this device contained ten repeating layers of 20 nm AlGaAs and 1.8 nm GaAs.

Figure 2:
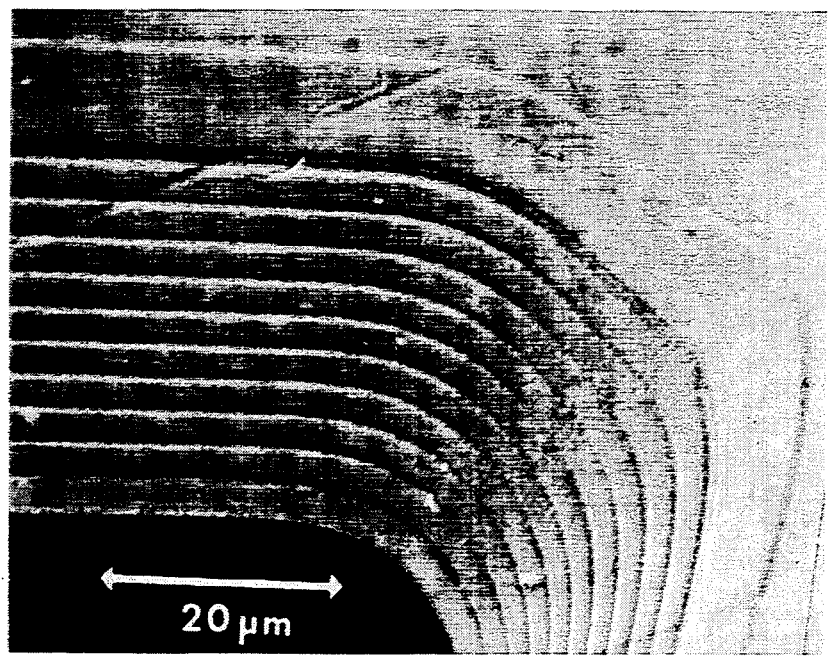
FIGS. 2 are an optical photograph of the shallow angle lapped p-HEMT depicted in FIG. 1 after chemical etching.

The thickness of the active InGaAs layer was nominally 15 nm. A rastered Ar+ ion beam was used at 2 keV accelerating potential. The sample was tilted 30° with respect to the energy analyzer. This resulted in an incident ion beam angle of 50° from the sample normal, due to chamber geometry. The asymmetry of the sputter crater walls was due in part to the wafer not being normal to the ion beam. The crater size for this analysis was 100 $\mu$m × 100 $\mu$m and the total sputtering time was 90 minutes. The shallow angle crater walls were due to the defocused Gaussian beam distribution, resulting in the same effect as mechanical angle lapping. As shown in FIG. 2, optical microscopy revealed the crater walls to be smooth. The superlattice and other layers were observable after chemical etching of the lapped area. The material that was removed by chemical etching was possibly ion beam damaged or redeposited sputtered material.

The wafer was etched for 5 seconds in a 1—1 bleach (5% sodium hypochlorite)-DI water solution, rinsed in DI water and blown dry with filtered nitrogen gas. This etch is preferential to GaAs. The etched sample was photographed at 1000× (FIG. 2) by optical microscopy using a green interference filter. The large dark area in the center represents the GaAs buffer layer. This area has a rough surface due to the high current flux of the central portion of the ion beam, whereas the crater walls are formed by the characteristic tailing off of the beam. Above this is a sequence of ten alternating wide and narrow stripes, which are the 20 nm AlGaAs and the 1.8 nm GaAs layers. The stripe after the last AlGaAs layer is a 1.8 nm GaAs plus the 3 nm AlGaAs spacer layer. The top wide stripe contains two areas: the lighter one is the 15 nm InGaAs active layer and the other is the 30 nm Si-doped AlGaAs donor layer. The large area beyond this layer is the GaAs cap layer, which has been etched down to an undetermined thickness. The two diagonal lines across the photograph are remnants of profilometer measurements made before chemical etching.

The observed contrast in this optical photograph results from the difference in etch rates between GaAs and AlGaAs. The magnification factor of the layers was calculated to be ~160× and the angle of lapping was calculated to be ~0.35° by assuming that the nominal layer thickness dimensions were correct and then measuring the actual dimensions on the micrograph. For example, along one edge the total superlattice dimension of 221 nm measured 35 $\mu$m on the micrograph. The calculated magnification factor and the lapping angle depends on the location of the measurement in the crater. If a measurement of the 221 nm superlattice is made in the steepest angle lapped section, the dimension on the micrograph is 12.5 $\mu$m, which gives a magnification of ~58× and a calculated angle lap of 1.0°. Calculation from profilometer measurements on the crater walls before chemical etching resulted in an angle of ~0.5°. Post-etch profilometer depth measurements were inconclusive due to surface roughness. Although there are variations in the lap angle around the circumference of the crater, the lap angle along the mid-portion of the gradient is approximately constant, which make thickness measurements meaningful.

Figure 3:
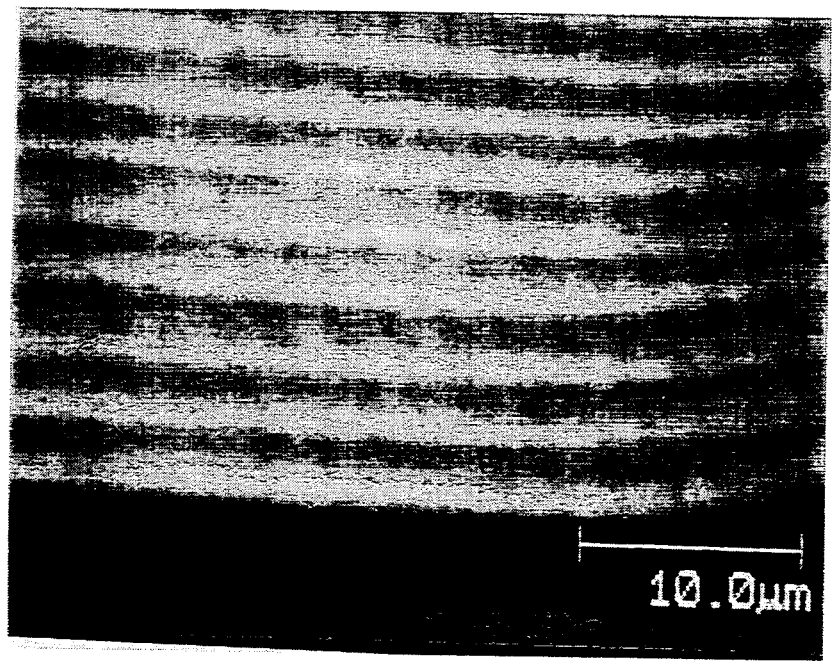
FIG. 3 is a Scanning Auger Microscopy (SAM) elemental aluminum map obtained on the shallow angle lapped region of the p-HEMT structure shown in FIG. 2 after ion and chemical etching.

The chemically etched sample was analyzed further using scanning Auger microscopy. Aluminum was observed on the surface layer of the lapped area. An elemental map for aluminum displayed alternating light and dark bands which correspond to the GaAs AlGaAs superlattice (FIG. 3). The GaAs layers (darker areas) appear larger than expected. This may be due to surface roughness caused by the etching process.

The combination of ion beam angle lapping and subsequent chemical etching has revealed superlattice structures with dimensions down to less than 2 nm in the GaAs—AlGaAs system. Although the experimental method did not yield absolute dimensions, the relative layer thicknesses were considered useful in the evaluation of the growth parameters used to produce these structures. Because such a small area is required for this destructive test, it could be used to make measurements in the thickness variations of nominally 10–15 nm thick active layers such as the InGaAs layer in a p-HEMT. It can also be used to probe regions where interlayer lattice mixing has occurred such as in the vicinity of an ohmic contact. This method can be made more quantitative by controlling the angle of ion beam lapping, such as making the angle of the ion beam 1° or less off parallel to the surface of the device, and by using thickness values obtained by TEM measurements on cross-sectioned structures to obtain the actual thicknesses which could then be used as standards to verify the lap angle.

Although the present invention has been described with regard to specific embodiments, the inventors wish it to be understood that these descriptions are merely examples of several methods of carrying out the present invention. Accordingly, this invention should only be limited by the present claims.

What is claimed is:

1. A method to determine thicknesses of layers in heterostructure devices comprising the steps of:
    forming a heterostructure device on a wafer;
    etching a crater in the wafer and heterostructure with an ion beam at a low angle wherein the low angle is below 2°;
    removing material from the crater with an etchant; and
    measuring the thickness of any layers in the crater along the low angle with magnifying measurement technique wherein the magnifying measurement technique includes the use of viewing the crater through an optical microscope and determining the thicknesses of layers of the heterostructure.

2. The method of claim 1 wherein the ion source is an Ar+ ion beam with a potential energy in the range of 5 to 2 kV.

3. The method of claim 1 wherein the ion beam source is rastered.

* * * * *